United States Patent [19]
Chiba et al.

[11] Patent Number: 6,005,910
[45] Date of Patent: *Dec. 21, 1999

[54] HOLDING MECHANISM, AND EXPOSURE APPARATUS USING THE MECHANISM

[75] Inventors: Yuji Chiba, Utsunomiya; Shinichi Hara, Kita Kawabe-machi, both of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/792,526

[22] Filed: Jan. 31, 1997

[30] Foreign Application Priority Data

Feb. 6, 1996 [JP] Japan ................................. 8-044246

[51] Int. Cl.⁶ ....................................................... G03F 7/20
[52] U.S. Cl. ............................................. 378/34; 378/208
[58] Field of Search ............................... 378/34, 35, 208; 250/491.1, 492.1, 492.2; 269/286, 309, 903

[56] References Cited

U.S. PATENT DOCUMENTS

| | | |
|---|---|---|
| 4,534,047 | 8/1985 | Deschenaux et al. ................ 378/35 |
| 4,539,695 | 9/1985 | La Fiandra ........................... 378/34 |
| 4,979,195 | 12/1990 | Tabata et al. ........................ 378/34 |
| 5,026,239 | 6/1991 | Chiba et al. ....................... 414/217 |
| 5,093,579 | 3/1992 | Amemiya et al. ................ 250/453.1 |
| 5,161,177 | 11/1992 | Chiba .................................. 378/34 |
| 5,220,171 | 6/1993 | Hara et al. ..................... 250/443.1 |
| 5,253,012 | 10/1993 | Chiba et al. ......................... 355/53 |
| 5,450,746 | 9/1995 | Howard ......................... 250/306 X |
| 5,485,495 | 1/1996 | Myiachi et al. ...................... 378/34 |
| 5,524,131 | 6/1996 | Uzawa et al. ....................... 378/34 |
| 5,544,213 | 8/1996 | Chiba et al. ......................... 378/34 |
| 5,608,773 | 3/1997 | Korenaga et al. ................... 378/34 |
| 5,684,856 | 11/1997 | Itoh et al. ........................... 378/34 |

FOREIGN PATENT DOCUMENTS 0 425 739 A1  5/1991  European Pat. Off. .

OTHER PUBLICATIONS

D.L. Laird, et al., "Practical Considerations in X–Ray Mask Mounting Methodology", J. Vacuum Sci. & Tech., Part B, vol. 11, No. 6, Nov. 1993, pp. 2953–2957, Throfare, NJ.

Primary Examiner—David P. Porta
Attorney, Agent, or Firm—Fitzpatrick, Cella, Harper & Scinto

[57] ABSTRACT

A holding mechanism includes a box body for providing a space for accommodating an X-ray mask, at least one opening formed at the side of the box body and a holding mechanism for holding the X-ray mask within the space by a kinematic mount system.

32 Claims, 7 Drawing Sheets

HOLDING MECHANISM, AND EXPOSURE APPARATUS USING THE MECHANISM

BACKGROUND OF THE INVENTION

1. Field of the Invention

The present invention relates to a holding apparatus capable of stably holding an original such as a mask, for example, without employing a magnet or a vacuum chuck in a semiconductor exposure apparatus, and an electron beam (EB) writing apparatus or a pattern dimension measuring apparatus, etc.

2. Related Background Art

An original such as a mask, for example, of a semiconductor exposure apparatus advancing in terms of a hyperfine structure with X-rays serving as exposure light beams, is generally manufactured by steps shown in FIGS. 8A–8F. To be specific, as illustrated in FIG. 8A, an SiC film M is deposited on at least one side of a substrate S composed of silicon. Then, as shown in FIG. 8B, a central portion of the substrate S is removed by back-etching, thereby forming an opening R covered with the SiC film (membrane) M. Thereafter, as depicted in FIG. 8C, an undersurface of the substrate S is bonded to a mask frame H, and, as shown in FIG. 8D, a pattern P of heavy metal is formed on the SiC membrane M at the opening R by a known EB writing method or by plating. Subsequently, as illustrated in FIG. 8E, a magnetic ring G is mounted on the undersurface of the mask frame H. When the thus manufactured mask is fixed to a mask stage T of the semiconductor exposure apparatus, as shown in FIG. 8F, the magnetic ring G on the undersurface of the mask frame H is adsorbed by a permanent magnet or an electromagnet W on the mask stage T.

Incidentally, in a step of forming the pattern P of the mask, or alternatively in a step of measuring a pattern dimension after completely manufacturing the mask, electron beams are used, and hence, a mask chuck involving the use of the permanent magnet and the electromagnet cannot be employed. Instead, the mask is fixed by use of a known vacuum adsorption device, a spring clamp and so forth.

When the mask is thus fixed by employing the vacuum adsorption device and the spring clamp, however, a distortion different from a case of being fixed to the mask stage of the exposure apparatus by the magnet or the electromagnet is caused, enough to produce a large change in the shape of the mask.

Under such circumstances, to obviate this problem, as illustrated in FIGS. 7A and 7B, there was developed a mask holding method based on a so-called kinematic mount system, by which the mask is clamped by three clamp forces Fa–Fc acting perpendicularly on the mask.

This method is that three pieces of balls Ba–Bc are applied onto the backsurface (or the upper surface) of a mask frame 102 of a mask 100; unillustrated clamp members are respectively made to approach the balls Ba–Bc; and the mask frame 102 of the mask 100 is clamped in between the respective balls Ba–Bc and the clamp members. Then, a position of the mask 100 in a perpendicular direction (a Z-axis direction) by the clamping forces Fa–Fc, respectively, and the first ball Bb engages with a conic groove 102a formed in the undersurface of the mask frame 102, thereby fixing only this portion within an X-Y plane perpendicular to the Z-axis. Subsequently, the second ball Ba slidably engages with a V-shaped groove 102b radially extending with respect to the conic groove 102a, thereby fixing a rotating position thereof. Note that the third ball Bc, brought into contact with a flat portion of the undersurface of the mask frame 102, is rollable in arbitrary directions, and is constructed so as not to unnecessarily restrain the mask 100.

More specifically, the construction is such that the mask 100 is positioned in totally hexa-axes directions of X-, Y- and Z-axes, and ωX-, ωY- and ωZ-axes of the mask 100 by making use of only the clamping forces Fa–Fc acting respectively through the three balls Ba–Bc. This kind of kinematic mask can be stably held without applying an unnecessary restraining force to the mask, and, besides, the exposure apparatus, the EB writing apparatus and the mask holding apparatuses such as a pattern inspecting apparatus can be all constructed the same, thereby making it possible to prevent the change in shape of the transfer pattern. Accordingly, this is suited to the high-accuracy X-ray exposure apparatus and EB exposure apparatus as well.

SUMMARY OF THE INVENTION

It is a primary object of the present invention, which was contrived to further improve a holding mechanism for holding an original by a kinematic mount system, to provide an excellent holding mechanism capable of miniaturizing the apparatus and surely holding the original at a high speed.

It is another object of the present invention to provide an exposure apparatus having this holding mechanism, and a device manufacturing method making use of the exposure apparatus.

To accomplish the above objects, according to one aspect of the present invention, a holding mechanism comprises a box body for providing a space for accommodating an original, an opening formed at the side portion of the box body, and a holding mechanism for holding the original within the space by a kinematic mount system.

Herein, the holding mechanism further comprises three pieces of clamping mechanism, and three pieces of protrusions facing thereto. Further, the holding mechanism holds the original perpendicularly. Also, the opening has a first opening for inserting the original into the space, and a second opening for taking the original out of the space. Moreover, the box body has a hole for allowing exposure energy to reach the original held in the space.

According to another aspect of the present invention, an exposure apparatus comprises a holding mechanism having a structure for holding the original, and an exposing device for exposing the original held by the holding mechanism to the exposure energy.

Herein, the exposure energy is X-rays.

According to still another aspect of the present invention, a device manufacturing method comprises a step of manufacturing a device by transferring a pattern of the original onto a substrate by use of the exposure apparatus.

Other objects and advantages of the present invention will become apparent during the following discussions of the preferred embodiments.

DESCRIPTION OF THE PREFERRED EMBODIMENTS

Embodiments of the present invention will hereinafter be discussed with reference to the accompanying drawings.

Figure 1:
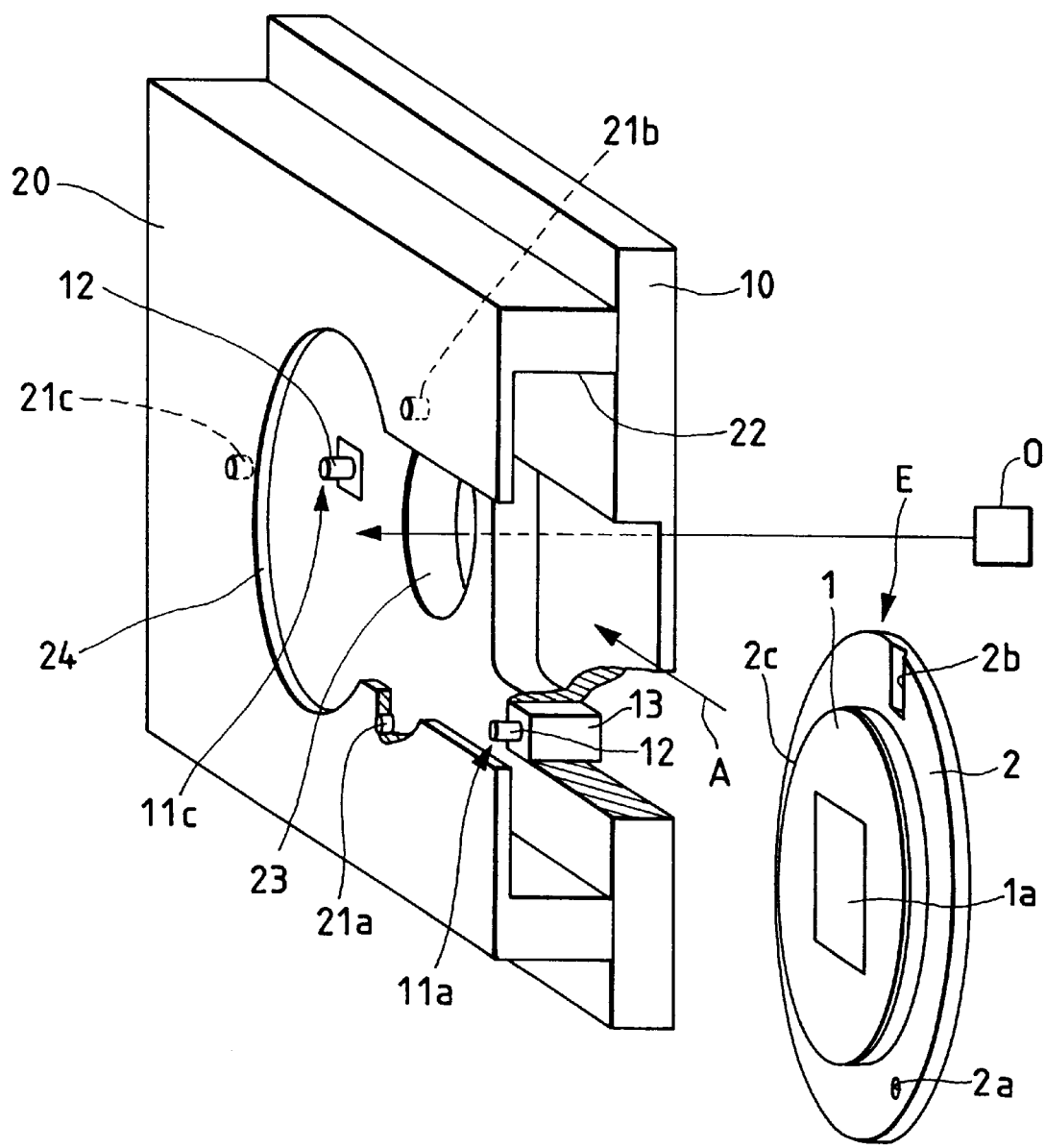
FIG. 1 is a perspective view illustrating a mask holding mechanism together with a mask in accordance with a first embodiment.
Figure 2:
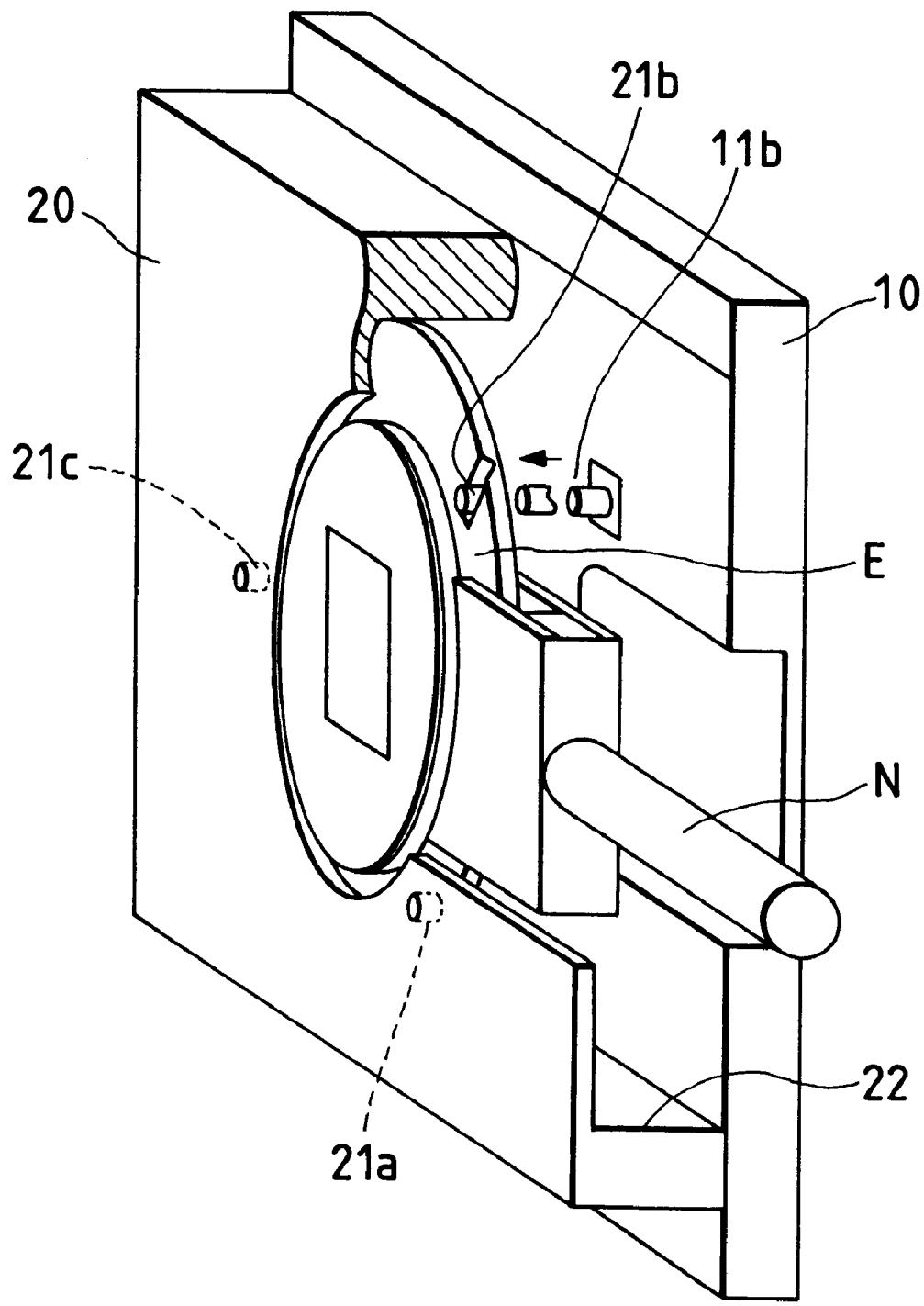
FIG. 2 is a perspective view showing a state where the mask is mounted on the apparatus shown in FIG. 1.

FIG. 1 shows an original holding apparatus in accordance with a first embodiment. This holding apparatus is employed for an exposure apparatus for exposing a wafer defined as a mask and a substrate with exposure energy such as X-rays and electron beams generated from a radiation source O serving as an exposure device, and for exposure-transferring a mask pattern on the wafer. The holding mechanism includes a base 10 having three clamp units 11a–11c (the clamp unit 11b is shown in FIG. 2) defined as a clamping mechanism, and a holding frame 20 having balls 21a–21c (spherical protrusions) fixed in face-to-face positions of the respective clamp units 11a–11c.

Formed in the interior of a box body consisting of the base 10 and the holding frame 20, is a space area defined as an original accommodation space large enough to accommodate a mask E serving as an original based on the kinematic mount system. Further, an opening 22 for inserting the mask E into the space area in an arrowed direction A and taking out the mask E in the direction reversed thereto, is formed in one side surface of the holding frame 20 at the side portion of the box body. Formed also are a hole 23 for permitting the exposure energy given from the radiation source O to reach the mask held in the space area, and a hole 24 for enabling the mask pattern to be exposure-transferred onto the wafer substrate disposed in close vicinity to and in a face-to-face relationship with the mask.

On the other hand, the mask E includes an Si substrate 1 for retaining a membrane 1a having an unillustrated pattern at the central opening, and a mask frame 2 for holding an outer peripheral portion thereof. An upper surface, as viewed in the Figure, of the mask frame 2 is provided with a conic groove 2a, a V-shaped groove 2b and a plane surface 2c with which the mask holders 21a–21c are capable of respectively coming into contact.

Each of the clamp units 11a–11c fixedly supported on the base 10 has a clamp member 12 protruding into a space area between the base 10 and the holding frame 20 in the interior of the box body, and a driving portion (an air cylinder) for moving the clamp member 12 up and down. The clamp member 12 is moved back and forth to the respective balls 21a–21c defined as the protrusions fixed to the holding frame 20, thereby clamping the mask E and releasing the mask E from being clamped.

The following is a way of how the mask E is carried and mounted (positioned) on the mask stage. As illustrated in FIG. 2, the mask frame 2 for the mask E is grasped by a carry hand N and then inserted via the opening 22 of the holding frame 20 into the space area between the base 10 and the holding frame 20. Then, the conic groove 2a, the V-shaped groove 2b and the plane surface 2c of the mask frame are located just under the balls 21a–21c. Subsequently, the clamp members 12 of the clamp units 11a–11c are raised and protruded by driving the driving portions 13 thereof, and the mask frame 2 is pressed and thus clamped by clamping forces acting perpendicularly between the respective balls 21a–21c. In this manner, the mask frame 2 for the mask E is fixed directly to the mask stage, and the mask E is held while standing vertically, resisting the gravity. Then, the mask is positioned with respect to the wafer substrate, and the exposure-transfer is executed. Further, an operation of demounting the mask E from the mask stage after the exposure-transfer has been done, involves lowering the clamp members 12 by reversely driving the driving portions 13 of the individual clamp units 11a–11c, and taking out the mask E in the direction opposite to the arrowed direction A.

Note that the driving portion of each clamp unit is not limited to the air cylinder but may involve the use of other double-acting types of actuators.

Figure 3:
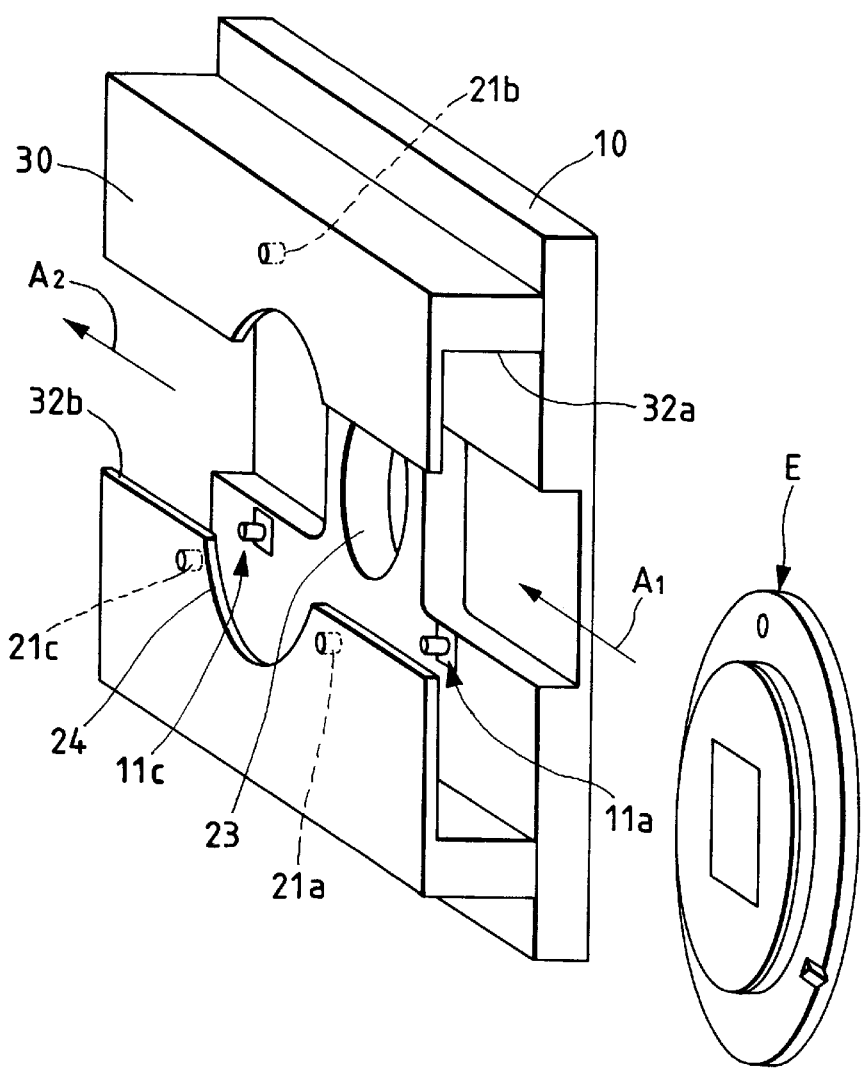
FIG. 3 is a perspective view illustrating the mask holding mechanism together with the mask in accordance with a second embodiment.

FIG. 3 illustrates the mask stage serving as the original holding apparatus in accordance with a second embodiment. This mask stage is formed with an opening 32b defined as a second opening for taking the mask E out of the interior of a holding frame 30 on the opposite side to a first opening 32a of the holding frame 30 similar to the holding frame 20 in the first embodiment. The mask E, the base 10, the clamp units 11a–11c and the balls 21a–21c are the same as those in the first embodiment and therefore are marked with like numerals, and explanations thereof are omitted. As indicated by an arrow $A_1$, the mask E is inserted into a space area between the base 10 and the holding frame 30 and then taken out of the second opening 32b as indicated by an arrow $A_2$.

The mask can be inserted into and taken out in the same direction substantially simultaneously, and hence, there must be added such an advantage that a mask replacing operation can be speeded up. Other points are the same as those in the first embodiment.

According to the thus constructed present apparatus, the mask can be stably fixed directly to the mask stage of the exposure apparatus by the kinematic mount system through no intermediary of the mask holder having a large weight. It is thereby possible to simplify and miniaturize the mask carry device of the exposure apparatus to a large extent, and also improve throughput by simplifying the mask replacing operation, etc. Additionally, a replacing time can be easily reduced by substantially simultaneously inserting and taking out the mask. Moreover, the mechanism such as the mask stage that holds the mask is also simplified, and the dimension thereof in the heightwise direction can be largely reduced enough to prevent damage to the mask when the mask falls down. As a result, the above construction might make a great contribution to the simplification and miniaturization of the mechanism of the whole exposure apparatus.

Figure 4:
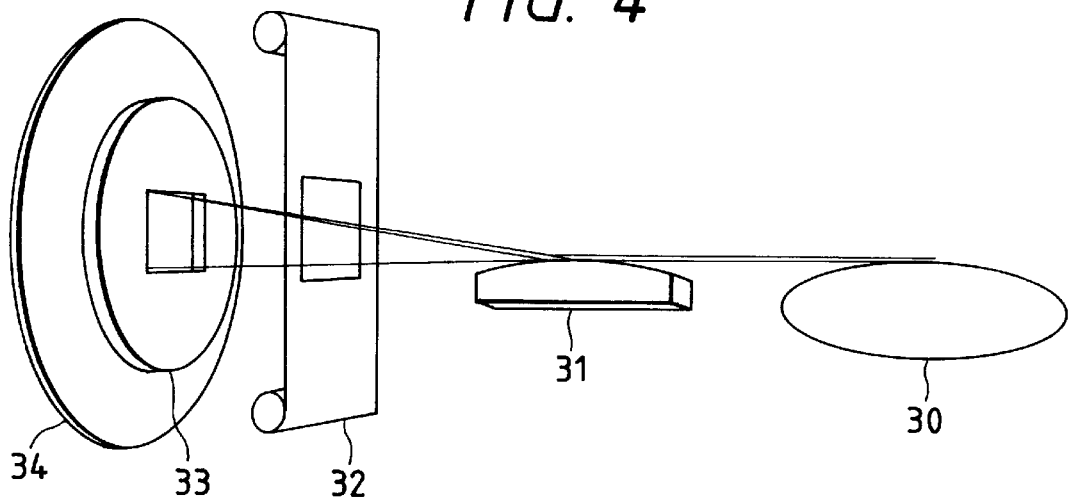
FIG. 4 is an explanatory view schematically showing a whole X-ray exposure apparatus.

FIG. 4 is a schematic view of an x-ray exposure apparatus, showing one example of the exposure apparatus including the above-described mask holding mechanism. High-luminance X-rays emitted from a synchrotron ring 30 are magnified and directed to the X-ray exposure apparatus by a total reflection mirror of an X-ray mirror 31. An exposure quantity control moving shutter 32 controls an exposure quantity when transferred. The X-rays passing through a shutter 32 further travel through an X-ray mask 33 and are subjected to patterning upon a resist on a wafer 34. The X-ray mask 33 is held by the mask holding mechanism having the structure illustrated in FIG. 1 or 3.

Figure 5:
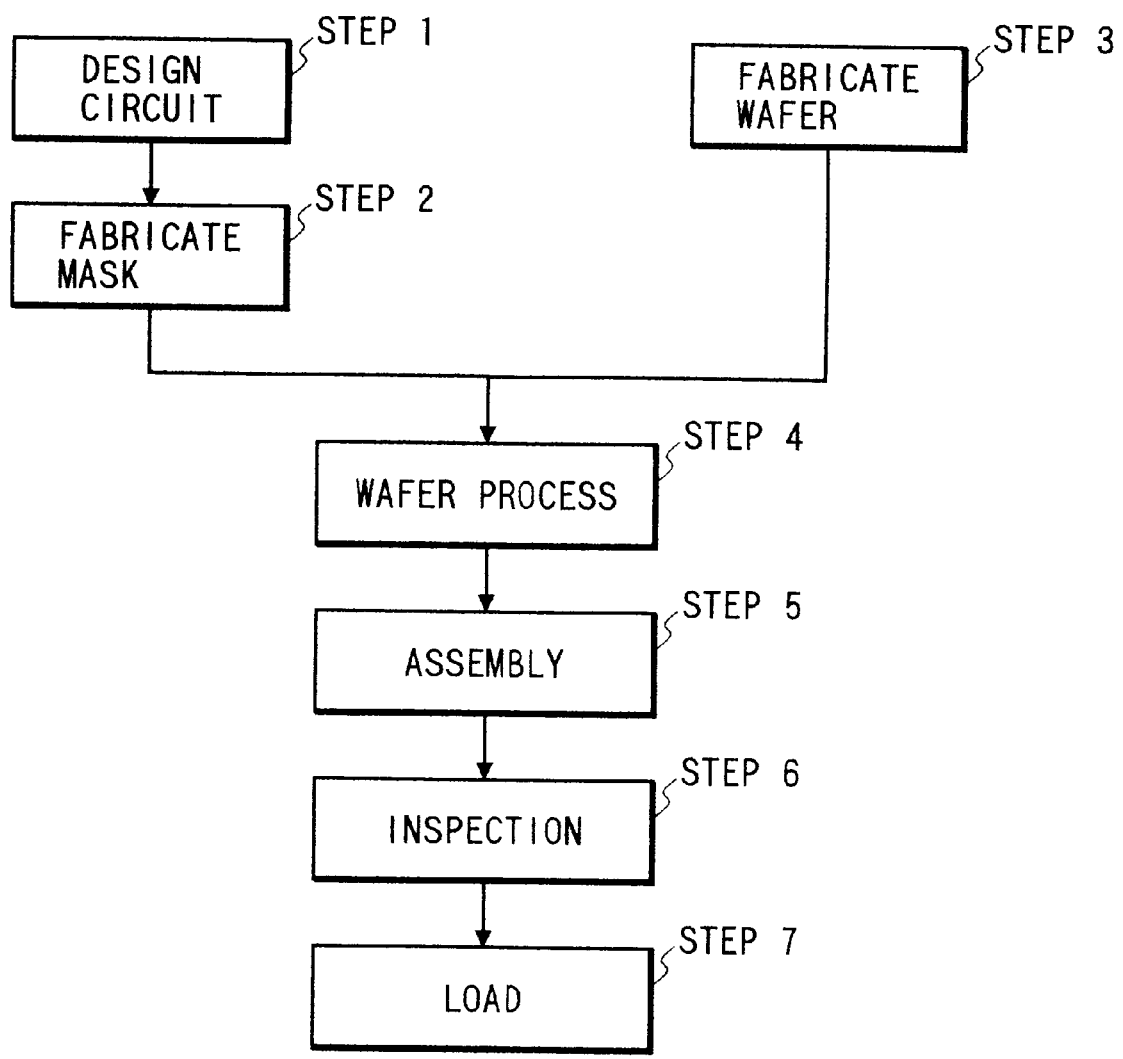
FIG. 5 is a flowchart showing a processing flow based on a device manufacturing method.

FIG. 5 is a flowchart showing a processing flow of manufacturing a semiconductor device (a semiconductor chip such as an IC or an LSI, a liquid crystal panel or a CCD) by using the above-mentioned exposure apparatus. In step 1, (circuit designing), a circuit of the semiconductor device is designed. In step 2 (mask fabrication), a mask formed with the designed circuit pattern is manufactured. In step 3 (wafer fabrication), the wafer is manufactured by use of a material such as silicon for example. Step 4 (wafer process) is termed a "pre-process", wherein an actual circuit is formed on the wafer based on the lithography technique by the use of the prepared mask and wafer. Step 5 (assembly) is called a "post-process", wherein a semiconductor chip is formed by use of the wafer manufactured in step 4. Step 5 includes an assembly step (dicing, and bonding), and a packaging step (chip sealing). Executed in step 6 (inspection) are inspections such as an operation confirming test and a durability test of the semiconductor device manufactured in step 5. The semiconductor device is completed through the above steps and comes to loading (step 7).

Figure 6:
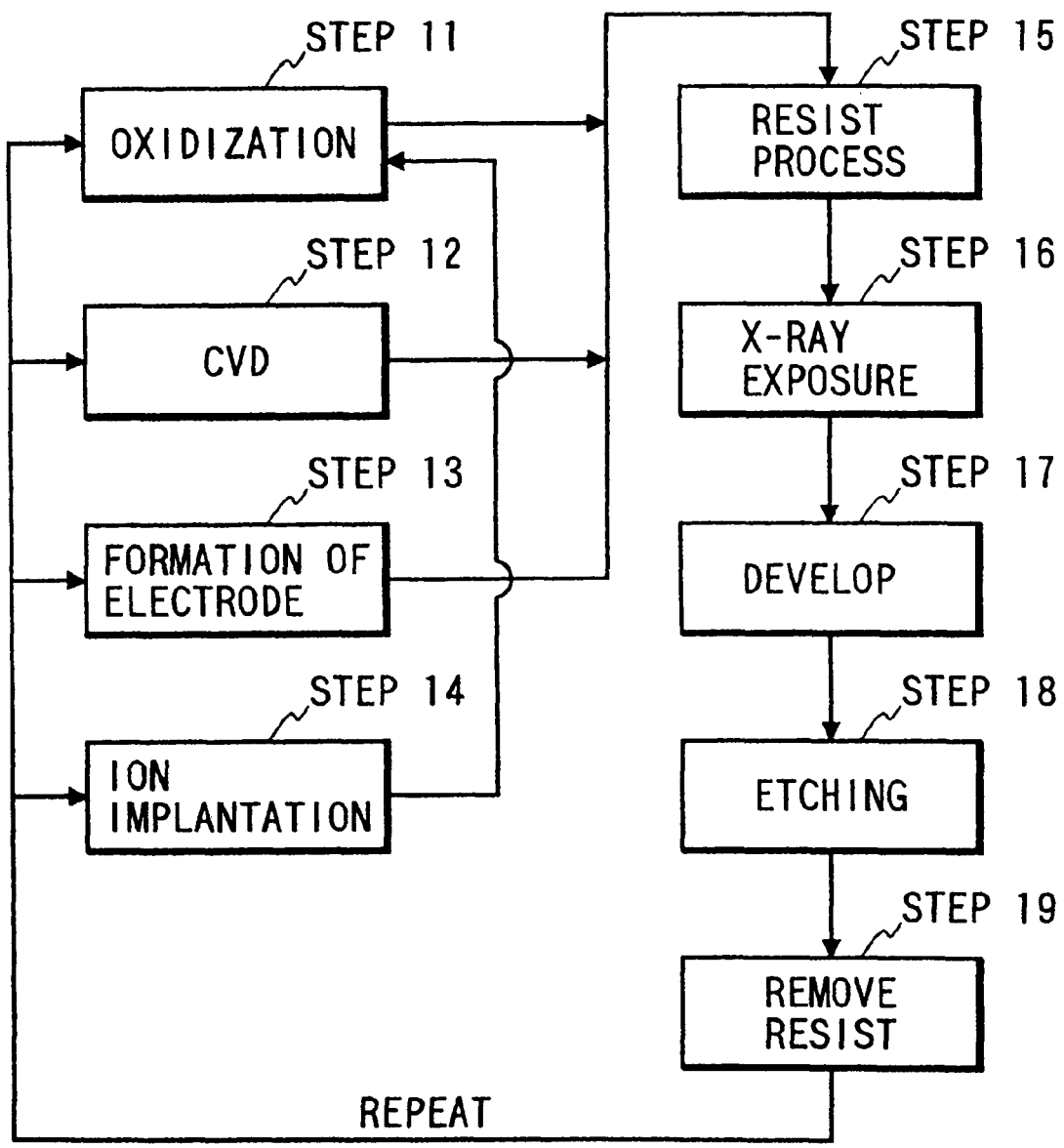
FIG. 6 is a flowchart showing a detailed flow of a wafer process.
Figure 7A:
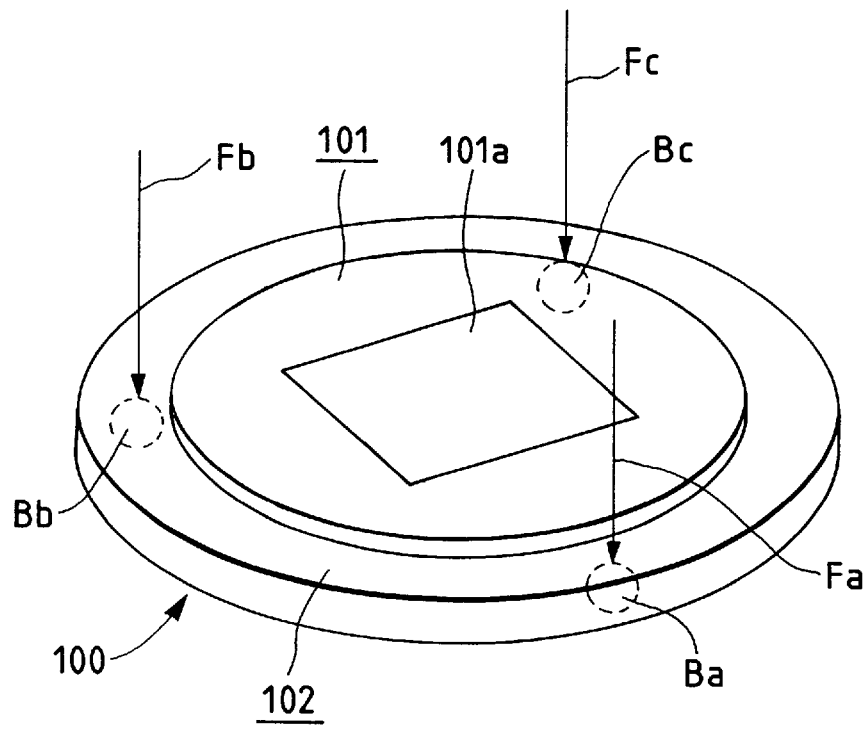
FIGS. 7A and 7B are explanatory views showing a mask based on a kinematic mount system.
Figure 7B:
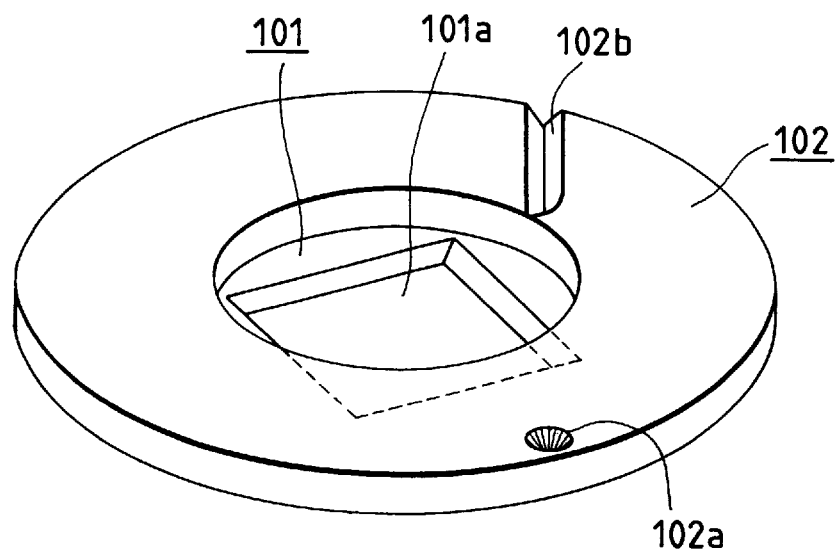
Figure 8A:
FIGS. 8A, 8B, 8C, 8D, 8E and 8F are explanatory views showing a mask manufacturing process.
Figure 8B:
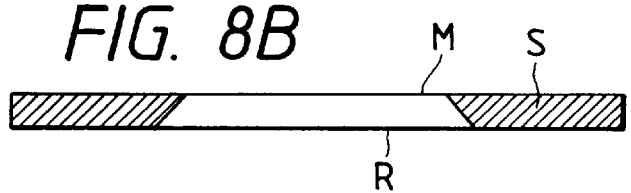
Figure 8C:
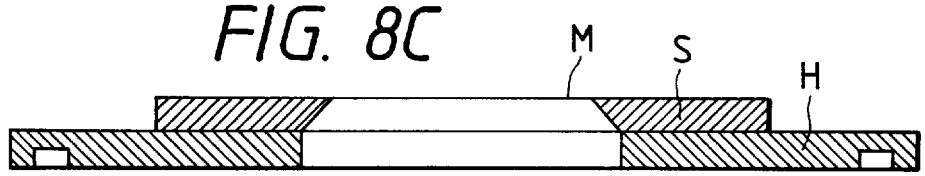
Figure 8D:
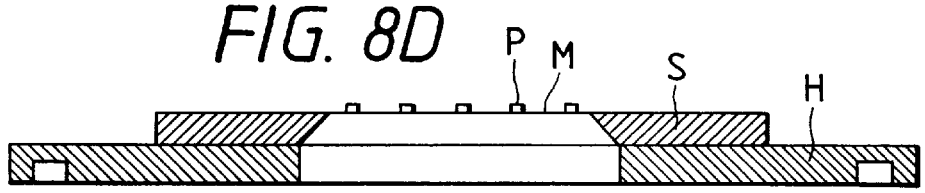
Figure 8E:
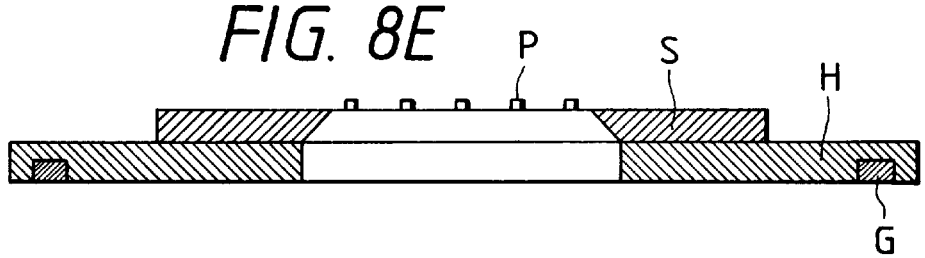
Figure 8F:
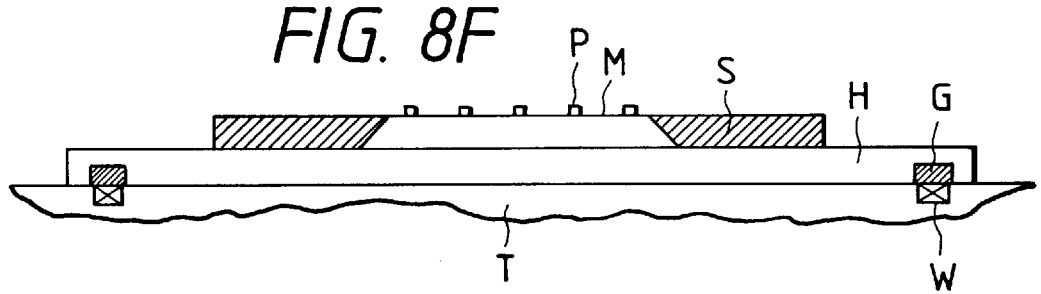

FIG. 6 is a flowchart showing a detailed processing flow of the above-described wafer process. In step 11 (oxidization), the wafer surface is oxidized. In step 12 (CVD), an insulating layer is formed on the wafer surface. In step 13 (electrode formation), an electrode is formed by deposition on the wafer. In step 14 (ion implantation), ions are implanted into the wafer. In step 15 (resist process), a photosensitive agent is applied on the wafer. In step 16 (exposure), the mask circuit pattern is printing-exposed on the wafer by the exposure explained above. In step 17 (development), the exposed wafer is developed. In step 18 (etching), areas excluding the developed resist image are removed by etching. In step 19 (resist removal), the unnecessary resist after etching is removed. The circuit patterns are formed in multiples on the wafer by repeating those steps.

It is apparent that, in this invention, a wide range of different working modes can be formed based on the invention without deviating from the spirit and scope of the invention.

What is claimed is:

1. A holding mechanism comprising:
   a box body for providing a space for accommodating an X-ray mask;
   at least one opening formed at the side of said box body; and
   a holding mechanism for holding the X-ray mask within the space by a kinematic mount system,
   wherein said box body comprises part of the kinematic mount system.

2. The holding mechanism according to claim 1, wherein said holding mechanism comprises three clamping mechanisms and three protrusions facing thereto, wherein said clamping mechanisms and said protrusions are provided on said box body.

3. The holding mechanism according to claim 1, wherein said holding mechanism holds the X-ray mask vertically.

4. The holding mechanism according to claim 1, wherein said at least one opening has a first opening for inserting the original into the space, and a second opening for taking the X-ray mask out of the space.

5. The holding mechanism according to claim 1, wherein said box body has a hole for allowing exposure energy to reach the X-ray mask held in the space.

6. The holding mechanism according to claim 1, wherein the X-ray mask comprises a substrate having a mask pattern and a frame for supporting the substrate, and wherein the holding mechanism holds the frame of the X-ray mask.

7. The holding mechanism according to claim 6, wherein said holding mechanism holds the frame by the kinematic mount system at a side on which the substrate is supported.

8. The holding mechanism according to claim 1, wherein said box body has a hole for allowing the mask pattern of the X-ray mask, held by said holding mechanism, to face a wafer.

9. The holding mechanism according to claim 1, further comprising a conveying hand for conveying the X-ray mask through said at least one opening.

10. A device manufacturing method comprising the steps of:
    providing a wafer and an X-ray mask;
    inserting the X-ray mask into a space of a box body;
    holding the X-ray mask within the space by a kinematic mount system, wherein the box body comprises part of the kinematic mount system;
    positioning the X-ray mask and the wafer in proximity to each other; and
    exposing the X-ray mask and the wafer with X-rays.

11. An exposure method for transferring a pattern of an X-ray mask onto a wafer, said method comprising the steps of:
    providing an X-ray mask, the X-ray mask including a mask substrate having a pattern and a frame on which the mask substrate is supported at one side;
    holding the X-ray mask by holding the frame of the X-ray mask by a kinematic mount system in a box body at the side on which the mask substrate is supported, wherein the box body comprises part of the kinematic mount system;
    positioning the X-ray mask and a wafer in proximity to each other; and
    exposing the X-ray mask and the wafer with X-rays.

12. A device manufacturing method comprising the steps of:
    providing a wafer and an X-ray mask, the X-ray mask including a mask substrate having a pattern and a frame on which the mask substrate is supported at one side;
    holding the X-ray mask by holding the frame of the X-ray mask by a kinematic mount system in a box body at the side on which the mask substrate is supported, wherein the box body comprises part of the kinematic mount system;
    positioning the X-ray mask and the wafer in proximity to each other; and
    exposing the X-ray mask and the wafer with X-rays.

13. An exposure apparatus for transferring a pattern of an X-ray mask onto a wafer, said apparatus comprising:
    a box body for providing a space for accommodating an X-ray mask;
    an opening formed at a side of said box body;
    a holding mechanism for holding the X-ray mask within the space by a kinematic mount system, wherein said box body comprises part of the kinematic mount system; and
    exposure means for exposing the X-ray mask, held by said holding mechanism, to the X-rays.

14. The exposure apparatus according to claim 13, wherein the X-ray mask and the wafer are disposed in proximity to each other.

15. An exposure apparatus for transferring a pattern of an X-ray mask onto a wafer, said apparatus comprising:
    a box body for providing a space for accommodating the X-ray mask;

a holding mechanism for holding the X-ray mask within the space by a kinematic mount system, wherein said box body has a hole for allowing the pattern of the X-ray mask, held by said holding mechanism, to face the wafer, and said box body comprises part of the kinematic mount system; and exposure means for exposing the X-ray mask held by said holding mechanism to the X-rays.

16. The exposure apparatus according to claim 15, further comprising a hole for introducing the X-rays into the space of the box.

17. The exposure apparatus according to claim 15, wherein the X-ray mask and the wafer are disposed in proximity to each other.

18. The exposure apparatus according to claim 15, wherein the X-ray mask comprises a substrate having a mask pattern and a frame for supporting the substrate, and said holding mechanism holds the frame of the X-ray mask.

19. The exposure apparatus according to claim 15, wherein said holding mechanism holds the frame by the kinematic mount system at a side on which the substrate is supported.

20. The exposure apparatus according to claim 15, further comprising a conveying hand for conveying the X-ray mask through said at least one opening.

21. The exposure apparatus according to claim 13, wherein said holding mechanism comprises three clamping mechanisms and three protrusions facing thereto, wherein said clamping mechanisms and said protrusions are provided on said box body.

22. The exposure apparatus according to claim 13, wherein said holding mechanism holds the X-ray mask vertically.

23. The exposure apparatus according to claim 13, wherein the X-ray mask comprises a substrate having a mask pattern and a frame for supporting the substrate, and wherein said holding mechanism holds the frame of the X-ray mask.

24. The exposure apparatus according to claim 13, wherein said holding mechanism holds the frame by the kinematic mount system at a side on which the substrate is supported.

25. The exposure apparatus according to claim 13, further comprising a conveying hand for conveying the X-ray mask through said at least one opening.

26. The exposure apparatus according to claim 15, wherein said holding mechanism comprises three clamping mechanisms and three protrusions facing thereto, wherein said clamping mechanisms and said protrusions are provided on said box body.

27. The exposure apparatus according to claim 15, wherein said holding mechanism holds the X-ray mask vertically.

28. A holding mechanism comprising:

a base;

a holding frame for providing a space for accommodating an X-ray mask, the space being provided between said holding frame and said base;

at least one opening for inserting and taking out the X-ray mask, formed at the side of the space; and a holding mechanism for holding the X-ray mask on said holding frame.

29. The holding mechanism according to claim 28, wherein said holding frame is fixed to said base.

30. The holding mechanism according to claim 28, wherein said holding frame has a hole for allowing exposure energy to reach the mask, and said base has a hole for allowing exposure light, which has passed the mask, to pass therethrough.

31. The holding mechanism according to claim 28, wherein said holding mechanism is a kinematic mount system.

32. A holding mechanism comprising:

a holding frame, which has a reference member, for positioning an original with respect to an exposure optical axis;

at least one opening formed at the side of a space within which a mask is held;

a holding mechanism for holding the original on the reference member within the space by a kinematic mount system; and a holding unit for urging the original from a radiation source side.

* * * * *